(12) United States Patent
Zenou et al.

(10) Patent No.: US 10,193,004 B2
(45) Date of Patent: Jan. 29, 2019

(54) LIFT PRINTING OF CONDUCTIVE TRACES ONTO A SEMICONDUCTOR SUBSTRATE

(71) Applicant: Orbotech Ltd., Yavne (IL)

(72) Inventors: Michael Zenou, Hashmonaim (IL); Zvi Kotler, Tel Aviv (IL)

(73) Assignee: ORBOTECH LTD., Yavne (IL)

( * ) Notice: Subject to any disclaimer, the term of this patent is extended or adjusted under 35 U.S.C. 154(b) by 0 days.

(21) Appl. No.: 15/509,491

(22) PCT Filed: Oct. 19, 2015

(86) PCT No.: PCT/IL2015/000046
§ 371 (c)(1),
(2) Date: Mar. 8, 2017

(87) PCT Pub. No.: WO2016/063270
PCT Pub. Date: Apr. 28, 2016

(65) Prior Publication Data
US 2017/0250294 A1     Aug. 31, 2017

Related U.S. Application Data

(60) Provisional application No. 62/065,689, filed on Oct. 19, 2014.

(51) Int. Cl.
*H01L 31/05*     (2014.01)
*H01L 31/0224*     (2006.01)
(Continued)

(52) U.S. Cl.
CPC ...... *H01L 31/022425* (2013.01); *B23K 26/00* (2013.01); *C23C 14/048* (2013.01);
(Continued)

(58) Field of Classification Search
CPC .................. H01L 31/022425; H01L 31/05
See application file for complete search history.

(56) References Cited

U.S. PATENT DOCUMENTS

| 3,963,852 A | 6/1976 | Baxter |
| 4,752,455 A | 6/1988 | Mayer |

(Continued)

FOREIGN PATENT DOCUMENTS

| DE | 10237732 A1 | 3/2004 |
| DE | 102012003866 B4 | 7/2013 |

(Continued)

OTHER PUBLICATIONS

U.S. Appl. No. 15/326,498 Office Action dated Jul. 12, 2017.
(Continued)

*Primary Examiner* — Mohammad Choudhry
(74) *Attorney, Agent, or Firm* — D. Kligler IP Services Ltd.

(57) ABSTRACT

A method for metallization includes providing a transparent donor substrate (34) having deposited thereon a donor film (36) including a metal with a thickness less than 2 pm. The donor substrate is positioned in proximity to an acceptor substrate (22) including a semiconductor material with the donor film facing toward the acceptor substrate and with a gap of at least 0.1 mm between the donor film and the acceptor substrate. A train of laser pulses, having a pulse duration less than 2 ns, is directed to impinge on the donor substrate so as to cause droplets (44) of the metal to be ejected from the donor layer and land on the acceptor substrate, thereby forming a circuit trace (25) in ohmic contact with the semiconductor material.

24 Claims, 3 Drawing Sheets

(51) Int. Cl.
    *H05K 3/14*      (2006.01)
    *H01L 21/48*     (2006.01)
    *H01L 21/285*    (2006.01)
    *B23K 26/00*     (2014.01)
    *C23C 14/04*     (2006.01)
    *C23C 14/28*     (2006.01)

(52) U.S. Cl.
    CPC .......... *C23C 14/28* (2013.01); *H01L 21/2855* (2013.01); *H01L 21/4846* (2013.01); *H05K 3/14* (2013.01); *H01L 31/05* (2013.01); *H05K 2203/0528* (2013.01); *H05K 2203/107* (2013.01); *H05K 2203/128* (2013.01); *Y02E 10/50* (2013.01)

(56) References Cited

U.S. PATENT DOCUMENTS

| | | |
|---|---|---|
| 4,891,183 A | 1/1990 | Corwin |
| 4,895,735 A | 1/1990 | Cook |
| 4,931,323 A | 6/1990 | Manitt et al. |
| 4,970,196 A | 11/1990 | Kim et al. |
| 4,987,006 A | 1/1991 | Williams et al. |
| 5,173,441 A | 12/1992 | Yu et al. |
| 5,292,559 A | 3/1994 | Joyce, Jr. et al. |
| 5,492,861 A | 2/1996 | Opower |
| 5,683,601 A | 11/1997 | Tatah |
| 5,725,914 A | 3/1998 | Opower |
| 5,935,758 A | 8/1999 | Patel et al. |
| 6,025,110 A | 2/2000 | Nowak |
| 6,155,330 A | 12/2000 | Kinane et al. |
| 6,159,832 A | 12/2000 | Mayer |
| 6,177,151 B1 | 1/2001 | Chrisey et al. |
| 6,261,493 B1 | 1/2001 | Gaylo et al. |
| 6,348,295 B1 | 2/2002 | Griffith et al. |
| 6,412,143 B1 | 7/2002 | Chen |
| 6,440,503 B1 | 8/2002 | Merdan et al. |
| 6,583,381 B1 | 6/2003 | Duignan |
| 6,600,457 B2 | 7/2003 | Heinz et al. |
| 6,649,861 B2 | 11/2003 | Duignan |
| 6,792,326 B1 | 9/2004 | Duignan et al. |
| 6,805,918 B2 | 10/2004 | Auyeung et al. |
| 6,815,015 B2 | 11/2004 | Young et al. |
| 6,822,189 B2 | 11/2004 | Hong et al. |
| 6,899,988 B2 | 5/2005 | Kidnie et al. |
| 6,921,626 B2 | 7/2005 | Ray et al. |
| 7,236,334 B2 | 6/2007 | Ding et al. |
| 7,277,770 B2 | 10/2007 | Huang et al. |
| 7,294,449 B1 | 11/2007 | Gudeman et al. |
| 7,358,169 B2 | 4/2008 | Zhu et al. |
| 7,364,996 B2 | 4/2008 | Kawase et al. |
| 7,423,286 B2 | 9/2008 | Handy et al. |
| 7,534,544 B2 | 5/2009 | Principe et al. |
| 7,608,308 B2 | 10/2009 | Liu et al. |
| 7,784,173 B2 | 8/2010 | Wolkin et al. |
| 7,799,699 B2 | 9/2010 | Nuzzo et al. |
| 7,938,855 B2 | 5/2011 | Gregorich et al. |
| 7,942,987 B2 | 5/2011 | Crump et al. |
| 7,982,296 B2 | 9/2011 | Nuzzo et al. |
| 8,025,542 B2 | 9/2011 | Birrell et al. |
| 8,056,222 B2 | 11/2011 | Pique et al. |
| 8,215,371 B2 | 7/2012 | Batchelder et al. |
| 8,216,931 B2 | 7/2012 | Zhang |
| 8,221,822 B2 | 7/2012 | Flanagan et al. |
| 8,262,916 B1 | 9/2012 | Smalley et al. |
| 8,395,083 B2 | 3/2013 | Naveh et al. |
| 8,420,978 B2 | 4/2013 | Jain et al. |
| 8,440,546 B2 | 5/2013 | Nuzzo et al. |
| 8,535,041 B2 | 9/2013 | Slafer |
| 8,545,931 B2 | 10/2013 | Szuch |
| 8,574,615 B2 | 11/2013 | Tenney et al. |
| 8,729,524 B2 | 5/2014 | Rogers et al. |
| 8,741,194 B1 | 6/2014 | Ederer et al. |
| 8,743,165 B2 | 6/2014 | Sandstriim |
| 9,027,378 B2 | 5/2015 | Crump et al. |
| 9,029,058 B2 | 5/2015 | Martin |
| 9,044,805 B2 | 6/2015 | Prest et al. |
| 9,446,618 B2 | 9/2016 | Batt et al. |
| 9,925,797 B2 | 3/2018 | Kotler et al. |
| 2002/0085085 A1 | 7/2002 | Fischer et al. |
| 2003/0006534 A1 | 1/2003 | Taboas et al. |
| 2004/0069471 A1 | 4/2004 | Corduan et al. |
| 2004/0233408 A1 | 11/2004 | Sievers |
| 2004/0241585 A1 | 12/2004 | Kato et al. |
| 2005/0056626 A1 | 3/2005 | Gross et al. |
| 2005/0095367 A1 | 5/2005 | Babiarz et al. |
| 2005/0112015 A1 | 5/2005 | Bampton |
| 2005/0211163 A1 | 9/2005 | Li et al. |
| 2005/0212888 A1 | 9/2005 | Lehmann et al. |
| 2006/0076584 A1 | 4/2006 | Kim et al. |
| 2007/0203584 A1 | 8/2007 | Bandyopadhyay et al. |
| 2007/0274028 A1 | 11/2007 | Hsu et al. |
| 2008/0006966 A1 | 1/2008 | Mannella |
| 2008/0041725 A1 | 2/2008 | Klein et al. |
| 2008/0233291 A1 | 9/2008 | Chandrasekaran |
| 2008/0245968 A1 | 10/2008 | Tredwell et al. |
| 2008/0286488 A1 | 11/2008 | Li et al. |
| 2008/0314881 A1 | 12/2008 | Ringeisen et al. |
| 2009/0074987 A1 | 3/2009 | Auyeung et al. |
| 2009/0130427 A1 | 5/2009 | Grigoropoulos et al. |
| 2009/0217517 A1 | 9/2009 | Pique et al. |
| 2010/0021638 A1 | 1/2010 | Varanka et al. |
| 2010/0022078 A1 | 1/2010 | Rockenberger et al. |
| 2010/0035375 A1 | 2/2010 | Grigoropoulos et al. |
| 2010/0100635 A1 | 9/2010 | Gold et al. |
| 2011/0003246 A1 | 1/2011 | Kurok |
| 2011/0097550 A1 | 4/2011 | Matusovsky et al. |
| 2011/0136162 A1 | 6/2011 | Sun et al. |
| 2011/0188016 A1 | 8/2011 | De Jager et al. |
| 2011/0278269 A1 | 11/2011 | Gold et al. |
| 2012/0015112 A1 | 1/2012 | Yang et al. |
| 2012/0025182 A1 | 2/2012 | Umeda et al. |
| 2012/0080088 A1 | 4/2012 | Grabitz et al. |
| 2012/0244321 A1 | 9/2012 | Hsu et al. |
| 2012/0247740 A1 | 10/2012 | Gertner et al. |
| 2013/0011562 A1 | 1/2013 | Varanka et al. |
| 2013/0029480 A1 | 1/2013 | Niklaus et al. |
| 2013/0037838 A1 | 2/2013 | Speier et al. |
| 2013/0176699 A1 | 7/2013 | Tonchev et al. |
| 2013/0302154 A1 | 11/2013 | Finlayson |
| 2013/0313756 A1 | 11/2013 | Chen et al. |
| 2013/0335504 A1 | 12/2013 | Sandstrom et al. |
| 2014/0097277 A1 | 4/2014 | Kumta et al. |
| 2014/0160452 A1 | 6/2014 | De Jaget et al. |
| 2014/0231266 A1 | 8/2014 | Sherrer et al. |
| 2014/0238574 A1 | 8/2014 | Kinser et al. |
| 2015/0024317 A1 | 1/2015 | Orrock et al. |
| 2015/0024319 A1 | 1/2015 | Martin |
| 2015/0086705 A1 | 3/2015 | Meinders et al. |
| 2015/0197063 A1 | 7/2015 | Shinar et al. |
| 2015/0197862 A1 | 7/2015 | Engel et al. |
| 2015/0294872 A1 | 10/2015 | Molpeceres Alvarez et al. |
| 2015/0097316 A1 | 12/2015 | Desimone et al. |
| 2015/0382476 A1 | 12/2015 | Zenou et al. |
| 2016/0218287 A1 | 7/2016 | McAlpine et al. |
| 2016/0233089 A1 | 8/2016 | Zenou et al. |
| 2016/0336303 A1 | 11/2016 | Tsai |
| 2017/0021014 A1 | 1/2017 | Boger |
| 2017/0189995 A1 | 7/2017 | Zenou et al. |
| 2017/0365484 A1 | 12/2017 | Kotler et al. |

FOREIGN PATENT DOCUMENTS

| | | |
|---|---|---|
| EP | 1847632 A1 | 10/2007 |
| EP | 2299784 A1 | 3/2011 |
| EP | 2660352 A1 | 11/2013 |
| EP | 3166143 A1 | 5/2017 |
| GB | 2453774 A | 4/2009 |
| JP | 0634283 A | 2/1994 |
| JP | H0634283 A | 2/1994 |
| JP | 11337227 A | 12/1999 |
| JP | 3871096 B2 | 1/2007 |
| JP | 2015144252 A | 8/2015 |
| WO | 2003056320 A2 | 7/2003 |

(56) References Cited

FOREIGN PATENT DOCUMENTS

| WO | 2007134300 A2 | 11/2007 |
|---|---|---|
| WO | 2009029119 A1 | 3/2009 |
| WO | 2009081355 A2 | 7/2009 |
| WO | 2009153792 A2 | 12/2009 |
| WO | 2010100635 A1 | 9/2010 |
| WO | 2012066338 A2 | 5/2012 |
| WO | 2013023874 A1 | 2/2013 |
| WO | 2013037838 A1 | 3/2013 |
| WO | 2013080030 A1 | 6/2013 |
| WO | 2013124114 A1 | 8/2013 |
| WO | 2013165241 A1 | 11/2013 |
| WO | 2014061024 A1 | 4/2014 |
| WO | 2015056253 A1 | 4/2015 |
| WO | 2015155662 A1 | 10/2015 |
| WO | 2015181810 A1 | 12/2015 |
| WO | 2016020817 A1 | 2/2016 |
| WO | 2016116921 A1 | 7/2016 |
| WO | 2016124712 A2 | 8/2016 |
| WO | 2017006306 A1 | 1/2017 |
| WO | 2017085712 A1 | 5/2017 |

OTHER PUBLICATIONS

Pique et al., "Laser Forward Transfer of Electronic and Power Generating Materials", Laser Ablation and its Applications, Chapter 14, pp. 339-373, Dec. 31, 2007.
Young et al., "Dielectric properties of oxide structures by a laser-based direct-writing method", Journal of Materials Research, vol. 16, No., pp. 1720-1725, Jun. 30, 2001.
Nagel et al., "Laser-Induced Forward Transfer for the Fabrication of Devices", Nanomaterials: Processing and Characterization with Lasers, First Edition, pp. 255-316, year 2012.
Papavlu et al.,"Laser Induced Forward Transfer for Materials Patterning", Romanian Reports in Physics, vol. 63, supplement, pp. 1285-1301, year 2011.
Zergioti et al., "Microdeposition of metals by femtosecond excimer lase", Applied Surface Science, vols. 127-129, pp. 601-605, year 1998.
Vispute et al., "Reactive deposition of YIBa2Cu30 7-x superconductor films by pulsed laser ablation from an unreacted mixture of Y203, BaCO 3 and CuO", Bulletin of Materials Science, vol. 15, No. 4, pp. 377-384, Aug. 1992.
Hecht.,"Multifrequency Acoustooptic Diffraction," IEEE Transactions on Sonics and Ultrasonics, vol. SU-24, No. 1, pp. 7-18, year 1977.
Trypogeorgos et al., "Precise shaping of laser light by an acousto-optic deflector", Optics Express, vol. 21, No. 21, pp. 24837-24846, Oct. 21, 2013.
International Application # PCT/IB2015/055862 Search Report dated Nov. 18, 2005.
International Application # PCT/IL2015/000027 Search Report dated Sep. 9, 2015.
Baseman.,"Formation of Metal Silicon Alloys by Laser Induced Forward Transfer", An IP.com Prior Art Database Technical Disclosure, 2 pages, Jul. 1, 1988.
Gehner., "MEMS Adaptive Optics Development at IPMS", Fraunhofer, Feb. 15, 2007.
Kumpulainen et al., "Low Temperature Nanoparticle Sintering with Continuous Wave and Pulse Lasers", Optics & Laser Technology 43, pp. 570-576, year 2011.
Theodorakos et al., "Selective Laser Sintering of Ag Nanoparticles Ink for Applications in Flexible Electronics", Applied Surface Science 336 , pp. 157-162, 2015.
Wang et al., "Silicon solar cells based on all-laser-transferred contacts", Progress in Photovoltaics: Research and Applications, 23, pp. 61-68 Jul. 19, 2013.
Willis et al., "Microdroplet deposition by laser-induced forward transfer", Applied Physics Letters, vol. 86, pp. 244103-1-244103-3, year 2005.

Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.
Banks et al., "Nanodroplets deposited in microarrays by femtosecond Ti:sapphire laser-induced forward transfer", Applied Physics Letters, vol. 89, pp. 193107-1-193107-3, year 2006.
Antonov., "Acoustooptic Nonpolar Light Controlling Devices and Polarization Modulators Based on Paratellurite Crystals", Technical Physics, vol. 49, No. 10, pp. 1329-1334, year 2004.
Antonov et al., "Improving the Efficiency of an Acoustooptic Modulator with a Two-Lobe Directivity Pattern by Correcting the Two-Frequency Electric Signal", ISSN 1063-7842, Technical Physics, vol. 51, No. 1, pp. 57-62, year 2006.
Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.
Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.
Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.
Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.
Antonov et al., "Switch multiplexer of fiber-optic channels based on multibeam acousto-optic diffraction", Applied Optics, vol. 48, No. 7, pp. C171-C181, Mar. 1, 2009.
Zenou et al., "Laser Transfer of Metals and Metal Alloys for Digital Microfabrication of 3D Objects", SMALL, vol. 11, issue 33, pp. 4082-4089, Sep. 2, 2015.
Zenou et al., "Solar cell metallization by laser transfer of metal micro-droplets", ScienceDirect, Energy Procedia, vol. 67, pp. 147-155, year 2015.
Bera et al., "Optimization study of the femtosecond laser-induced forward-transfer process with thin aluminum films", Applied Optics, vol. 46, No. 21, pp. 4650-4659, Jul. 20, 2007.
Li et al., "Microdroplet deposition of copper film by femtosecond laser-induced forward transfer", Applied Physics Letters, vol. 89, pp. 161110-4-161110-4, year 2006.
Roder et al., "Low Temperature Laser Metallization for Silicon Solar Cells", ScienceDirect, Energy Procedia, vol. 8, pp. 552-557, year 2011.
Tien et al., "Precision laser metallization", Microelectronic Engineering, vol. 56, pp. 273-279, year 2001.
Fraunhofer IPMS, Spatial Light Modulators (SLM), 2 pages, Jun. 7, 2016.
Fraunhofer IPMS, "Micro Mirror Arrays (MMA) from DUV to NIR", 2 pages, Jun. 7, 2016.
Gehner et al., "Mems AO Micro Mirror Development at IPMS", Status and Perspectives, Fraunhofer IPMS, 30 pages, May 4, 2016.
BWT Beijing, "K915FG2RN-150.0W, 915nm 150W High Power Fiber Coupled Diode Laser", 4 pages, Jul. 1, 2016.
Zenou et al., "Digital laser printing of aluminum microstructure on thermally sensitive substrates", Journal of Physics D: Applied Physics 48 , 205303 12 pages , 2015.
Willis et al., "The effect of melting-induced volumetric expansion on initiation of laser-induced forward transfer", Applied Surface Science 253, pp. 4759-4763, 2007.
Schultze et al., "Laser-induced forward transfer of aluminium", Applied Surface Science 52, pp. 303-309, 1991.
Pique, A., "Laser Transfer Techniques for Digital Microfabrication", vol. 135 of the series Springer Series in Materials Science, Chapter 11, pp. 259-291, Jun. 30, 2010.
Bohandy et al., "Metal deposition from a supported metal film using an excimer laser", Journal of Applied Physics, vol. 60, No. 4, pp. 1538-1539, Aug. 15, 1986.
Adrian et al., "A study of the mechanism of metal deposition by the laser-induced forward transfer process", Journal of Vacuum Science and Technology B, vol. 5, No. 5, pp. 1490-1494, Sep./Oct. 1987.

(56) References Cited

OTHER PUBLICATIONS

Tan et al., "Selective surface texturing using femtosecond pulsed laser induced forward transfer", Applied Surface Scienc, vol. 207, pp. 365-371, year 2003.
European Application # 16739878 search report dated Jan. 2, 2018.
Vaezi et al., "A review on 3D micro-additive manufacturing technologies", The International Journal of Advanced Manufacturing Technology, vol. 67, issue 5-8, pp. 1721-1754, Jul. 2013.
Pique, A., "Rapid Prototyping of Embedded Microelectronics by Laser Direct-Write", Rapid Prototyping Technology—Principles and Functional Requirements, Chapter 12, pp. 247-272, Sep. 2011.
International Application PCT/IL2016/051180 Search Report dated Jan. 29, 2017.
Emeric et al., "Multi-jets formation using laser forward transfer", Applied Surface Science, vol. 302, pp. 153-158, year 2014.
Fardel et al., Laser-Induced Forward Transfer of Organic LED Building Blocks Studied by Time-Resolved Shadowgraphy, The journal of Physical Chemistry, vol. 114, issue 12, pp. 5617-5636, year 2010.
Zhang., "Functional Material and Application Thereof", China Machine Press, 5 pages (relevant pp. 86-87), Jan. 2009 (only abstract is available in English).
European Application # 15852999 search report dated May 11, 2018.
European Application # 14853466 search report dated Jul. 7, 2018.
European Application # 14751180 search report dated Nov. 9, 2016.
Biver et al., "Multi-jets formation using laser forward transfer", Applied Surface Science , vol. 302 , pp. 153-158, May 30, 2014.
Pique et al., "Laser Direct-Write of Embedded Electronic Components and Circuits", In Photon processing in Microelectronics and Photonics IV, vol. 5713, pp. 223-231, Apr. 1, 2005.
Barnett et al., "Integrating Electronics", 7 pages, Feb. 4, 2017.
International Application # PCT/IL2018/050455 search report dated Jul. 30, 2018.
Baseman et al., "Laser Induced Forward Transfer", Materials research society symposium proceedings, vol. 101, pp. 237-242, year 1988.
Toth et al., "Laser-induced compound formation and transfer of stacked elemental layers", Thin Solid Films, vol. 245, issues 1-2, pp. 40-43, Jun. 1, 1994.

LIFT PRINTING OF CONDUCTIVE TRACES ONTO A SEMICONDUCTOR SUBSTRATE

CROSS-REFERENCE TO RELATED APPLICATIONS

This application claims the benefit of U.S. Provisional Patent Application 62/065,689, filed Oct. 19, 2014, which is incorporated herein by reference.

FIELD OF THE INVENTION

The present invention relates generally to laser-induced material transfer, and particularly to methods and apparatus for producing conductive traces on a substrate by laser-induced forward transfer (LIFT).

BACKGROUND

In laser direct-write (LDW) techniques, a laser beam is used to create a patterned surface with spatially-resolved three-dimensional structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier before the photons are absorbed by the inner surface of the film. Above a certain energy threshold, material is ejected from the donor film toward the surface of the substrate, which is generally placed, in LIFT systems that are known in the art, either in close proximity to or even in contact with the donor film. The applied laser energy can be varied in order to control the thrust of forward propulsion that is generated within the irradiated film volume. Nagel and Lippert provide a useful survey of the principles and applications of LIFT in micro-fabrication in "Laser-Induced Forward Transfer for the Fabrication of Devices," published in *Nanomaterials: Processing and Characterization with Lasers*, Singh et al., eds. (Wiley-VCH Verlag GmbH & Co. KGaA, 2012), pages 255-316.

LIFT techniques using metal donor films have been developed for a variety of applications, such as repair of electrical circuits. For example, PCT International Publication WO 2010/100635, whose disclosure is incorporated herein by reference, describes a system and method of repairing electrical circuits in which a laser is used to pre-treat a conductor repair area of a conductor formed on a circuit substrate. The laser beam is applied to a donor substrate in a manner that causes a portion of the donor substrate to be detached therefrom and to be transferred to a predetermined conductor location.

As another example, U.S. Patent Application Publication 2011/0097550 describes a method of depositing a material on a receiving substrate. The method comprises providing a source substrate having a back surface and a front surface, the back surface carrying at least one piece of coating material. A receiving substrate is positioned adjacent to the source substrate and facing the coating material. Light is radiated towards the front surface of the source substrate, to remove at least one piece of the coating material from the source substrate and deposit the piece onto the receiving substrate as a whole. In accordance with an exemplary embodiment of the invention, the produced receiving substrates serve as solar cells, and a solar flat panel may be produced by connecting electrically multiple cells.

Another laser-based method for metallization of solar cells is described by Wang et al., in an article entitled "Silicon solar cells based on all-laser-transferred contacts," published in *Progress in Photovoltaics: Research and Applications* 23 (2015), pages 61-68. Crystalline silicon solar cells based on laser-transferred contacts were fabricated with both front and rear metallization achieved through laser-induced forward transfer. Both the front and rear contacts were laser-transferred from a glass slide coated with a metal layer to the silicon substrate already processed with emitter formation, surface passivation, and antireflection coating. Ohmic contacts were achieved after this laser transfer.

SUMMARY

Embodiments of the present invention that are described hereinbelow provide novel techniques for LIFT that can be used in deposition of conductive traces on semiconductor substrates.

There is therefore provided, in accordance with an embodiment of the invention, a method for metallization, which includes providing a transparent donor substrate having deposited thereon a donor film including a metal with a thickness less than 2 µm. The donor substrate is positioned in proximity to an acceptor substrate including a semiconductor material with the donor film facing toward the acceptor substrate and with a gap of at least 0.1 mm between the donor film and the acceptor substrate. A train of laser pulses, having a pulse duration less than 2 ns, is directed to impinge on the donor substrate so as to cause droplets of the metal to be ejected from the donor layer and land on the acceptor substrate, thereby forming a circuit trace in ohmic contact with the semiconductor material.

Typically, the thickness of the donor film is between 0.3 µm and 1.5 µm, and the pulse duration is between 0.1 ns and 1 ns, or possibly less than 0.5 ns. In a disclosed embodiment, the laser pulses have an energy of at least 3 µJ per pulse, and directing the train of pulses includes focusing the laser pulses to impinge on the donor film with a spot size less than 35 µm.

In the disclosed embodiments, directing the train of laser pulses includes setting parameters of the laser radiation so that each pulse induces ejection of a single droplet of the metal from the donor film. Typically, the single droplet ejected in response to each pulse has a volume of at least 20 $\mu m^3$ and is ejected from the donor film at a velocity of at least 200 m/sec.

In some embodiments, positioning the donor substrate includes placing the donor substrate so that the gap between the donor film and the acceptor substrate is at least 0.2 mm. Additionally or alternatively, positioning the donor substrate includes positioning the donor and acceptor substrates together in an atmosphere of ambient air, wherein the droplets of the metal pass through the ambient air between the donor and acceptor substrates.

In a disclosed embodiment, directing the laser pulses includes forming the circuit trace with a contact resistance, without annealing of the circuit trace, that is less than 0.2 $m\Omega \cdot cm^2$ between the metal and the semiconductor material. In one embodiment, the acceptor substrate includes a silicon wafer, which is configured as a photovoltaic cell, and the metal includes aluminum.

There is also provided, in accordance with an embodiment of the invention, apparatus for material deposition, including a transparent donor substrate having deposited thereon a donor film including a metal with a thickness less than 2 μm. A positioning assembly is configured to position the donor substrate in proximity to an acceptor substrate including a semiconductor material with the donor film facing toward the acceptor substrate and with a gap of at least 0.1 mm between the donor film and the acceptor substrate. An optical assembly is configured to direct pulses of laser radiation, having a pulse duration less than 2 ns, to impinge on the donor substrate so as to cause droplets of the a metal to be ejected from the donor layer and land on the acceptor substrate, thereby forming a circuit trace in ohmic contact with the semiconductor material.

The present invention will be more fully understood from the following detailed description of the embodiments thereof, taken together with the drawings in which:

DETAILED DESCRIPTION OF EMBODIMENTS

In the solar photovoltaic industry, metal traces are produced on solar cells by large-scale screen printing techniques using metal micro-particle pastes. Although this approach is reliable and cost-effective, it results in solar cells with reduced efficiency, relative to an ideal process, due to poor contact quality and shadowing of the underlying silicon. A number of alternative techniques have been proposed, including LIFT-based techniques such as those mentioned above in the Background section, but none has yet proven commercially feasible.

Embodiments of the present invention that are described herein provide novel methods and apparatus for LIFT printing of metal traces on semiconductor substrates. These techniques are capable of producing high-quality ohmic contacts, at high speed, without requiring subsequent annealing. In contrast to LIFT methods that are known in the art, the techniques described herein can be applied with the donor film positioned relatively far away from the acceptor substrate, with a gap of at least 0.1 mm, and possibly even 0.2 mm or more, between donor and acceptor. Such techniques can be implemented in an atmosphere of ambient air, wherein LIFT-ejected droplets of metal pass through the ambient air between the donor and acceptor substrates. The disclosed techniques are thus particularly applicable to large-scale metallization of silicon photovoltaic cells, although they may also be applied in writing metal traces on other sorts of semiconductor substrates.

The disclosed embodiments use a transparent donor substrate having deposited thereon a donor film comprising a metal, such as aluminum, titanium or nickel, with a thickness that is less than 2 μm, and is typically between 0.3 μm and 1.5 μm. The donor substrate is positioned in proximity to an acceptor substrate comprising a semiconductor material, such as silicon, with a gap of at least 0.1 mm between the donor film and the acceptor substrate, as noted above. A train of laser pulses is directed to impinge on the donor substrate so as to cause droplets of the metal to be ejected from the donor layer and land on the acceptor substrate, thereby forming a circuit trace in ohmic contact with the underlying semiconductor material.

The laser pulses have a pulse duration that is less than 2 ns, and is typically between 0.1 ns and 1 ns or possibly even less than 0.5 ns. The laser pulses have an energy of at least 3 μJ per pulse, and are focused to impinge on the donor film with a spot size less than 35 μm. Under such conditions, each laser pulse induces ejection of a single droplet of the metal from the donor film. The use of very short pulses, between 0.1 and 0.5 ns, at the appropriate fluence, is particularly effective in ensuring reliable emission of a single droplet per pulse with the desired droplet size and velocity.

Typically, the single droplet ejected in response to each pulse has a volume of at least 20 μm³ and is ejected from the donor film at a velocity of at least 200 m/sec. The high temperature and momentum with which the droplets strike the semiconductor substrate under these conditions result in immediate formation of a low-resistance ohmic contact with the substrate, in part because the thin oxide layer that forms around the metal droplet breaks upon impact with the substrate. The inventors have found that circuit traces formed on silicon wafers by this technique have a contact resistance, without annealing of the circuit trace, of less than 0.2 mΩ·cm² between the metal and the wafer. Alternatively, the contact quality can be varied (providing higher resistance and even diode-like properties) by adjusting the laser pulse parameters.

Figure 1:
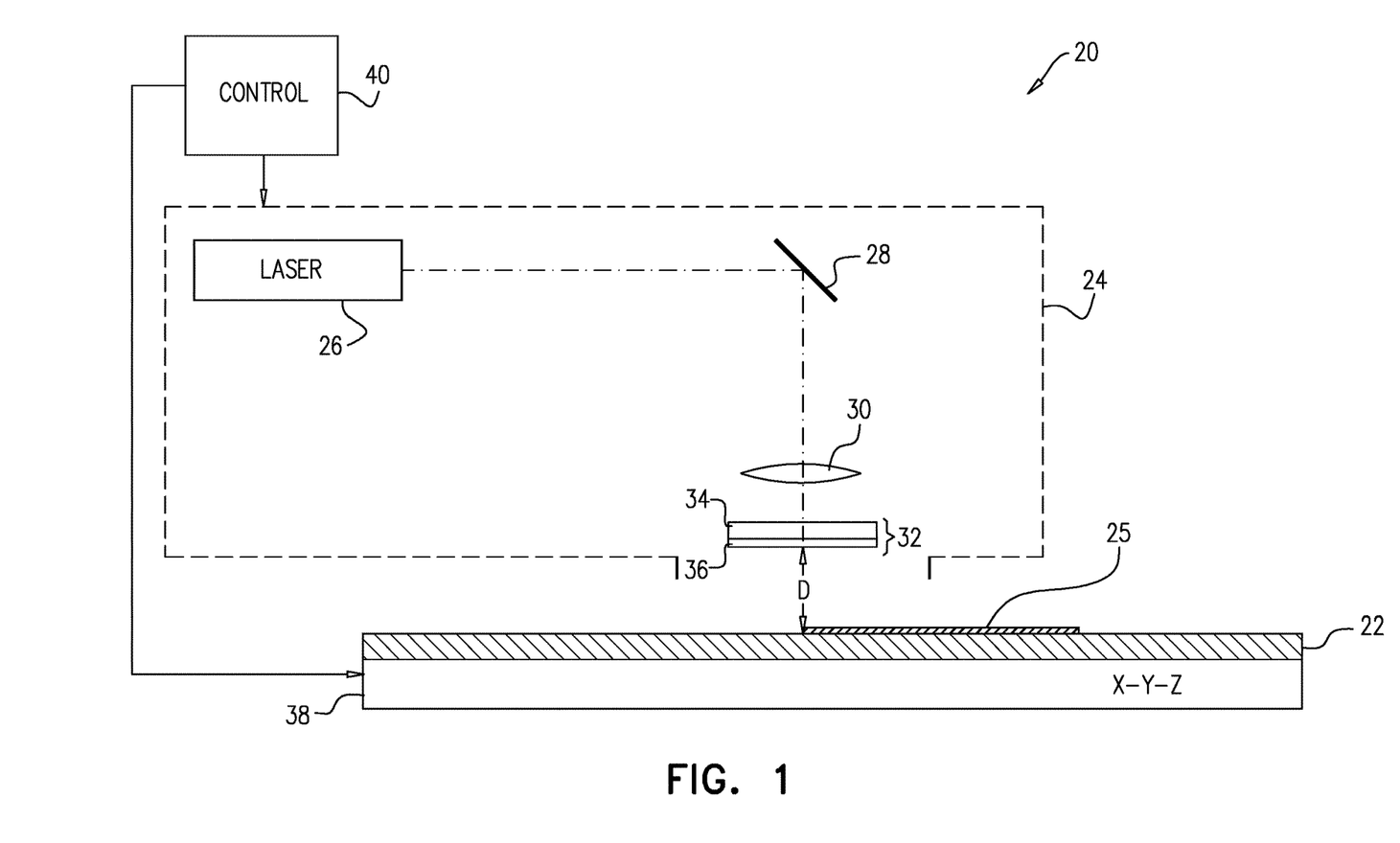
FIG. 1 is schematic side view of a system for LIFT-based material deposition, in accordance with an embodiment of the present invention.

FIG. 1 is a schematic side view of a system 20 for LIFT-based material deposition on an acceptor substrate 22, in accordance with an embodiment of the present invention. System 20 comprises an optical assembly 24, in which a laser 26 emits pulsed radiation, which is focused by suitable optics 30 onto a LIFT donor sheet 32. Acceptor substrate 22 typically comprises a semiconductor material, such as a silicon wafer, on which a metal trace 25 is to be printed. The areas on which trace 25 is printed in this manner may comprise, for example, p-type, p+ type, or n-type silicon.

Donor sheet 32 comprises a donor substrate 34 with a donor film formed on the surface that faces toward acceptor substrate 22. Donor substrate 34 comprises a transparent optical material, such as a glass or plastic sheet, while donor film 36 comprises a suitable metallic material, such as aluminum, nickel or titanium (or alloys of such metals), with a film thickness less than 2 μm. Typically, the thickness of the donor film is between 0.3 μm and 1.5 μm. Optics 30 focus the beam from laser 26 to pass through the outer surface of donor substrate 34 and to impinge on donor film 36, thereby causing droplets of molten metal to be ejected from the film, across the gap and onto acceptor substrate 22. This LIFT process is described in greater detail hereinbelow with reference to FIGS. 2A and 2B.

Laser 26 comprises, for example, a pulsed Nd:YAG laser with frequency-doubled output, which permits the pulse amplitude to be controlled conveniently by a control unit 40. Typically, for good LIFT deposition results, as described below, the pulse duration is in the range of 0.1 ns to 1 ns, and may be less than 0.5 ns. Optics 30 are similarly controllable in order to adjust the size of the focal spot formed by the laser beam on donor sheet 32. A scanner 28, such as a rotating mirror and/or an acousto-optic beam deflector under control of control unit 40, scans the laser beam so as to irradiate different spots on donor sheet 32. Control unit 40 thus controls optical assembly 24 so as to write donor material from film 36 over a predefined locus on substrate 22 and to make multiple passes, as needed, in order to build up the deposited traces of the donor material to a desired width and height. For example, system 20 may operate in this manner to produce conductive traces less than 15 µm wide and with a thickness from 10 µm up to several tens of microns, thus creating traces 25 with both low resistance and minimal shadowing of the underlying substrate 22.

Control unit 40 causes a positioning assembly 38 to shift either acceptor substrate 22 or optical assembly 24, or both, in order to position donor substrate 34 in proximity to acceptor substrate 22 and to align the beam from laser 26 with the locus on the acceptor substrate onto which trace 25 is to be written. Donor sheet 32 is positioned above this locus in proximity to acceptor substrate 22, at a desired gap width D from the acceptor substrate. Typically, this gap width is at least 0.1 mm, and the inventors have found that gap widths of 0.2 mm or even 0.5 mm or greater can used, subject to proper selection of the laser beam parameters.

Typically, control unit 40 comprises a general-purpose computer, with suitable interfaces for controlling and receiving feedback from optical assembly 24, motion assembly 38, and other elements of system 20. System 20 may comprise additional elements (omitted from the figures for the sake of simplicity), such as an operator terminal, which can be used by an operator to set the functions of the system, and an inspection assembly, for monitoring the deposition process. These and other ancillary elements of system 20 will be apparent to those skilled in the art and are omitted from the present description for the sake of simplicity. Further aspects of a LIFT system similar to that shown here are described in PCT Patent Application PCT/IL2015/000027, filed May 20, 2015, whose disclosure is incorporated herein by reference.

Figure 2A:
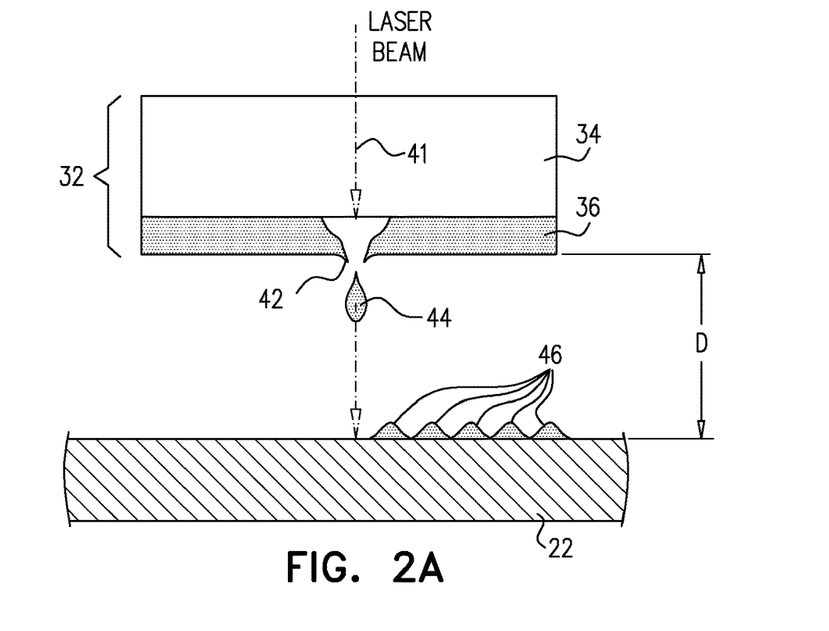
FIG. 2A is a schematic sectional view of a deposition site on an acceptor substrate, showing LIFT-driven ejection of a metal droplet toward the site in accordance with an embodiment of the present invention.

FIG. 2A is a schematic sectional view of a deposition site on substrate 22, showing LIFT-driven ejection of a metal droplet 44 from donor film 36 toward the site, in accordance with an embodiment of the present invention. This figure illustrates the effect of irradiating film 36 with a laser pulse whose duration is comparable to the time required for heat diffusion through the film. Details of this process are described, for example, in Japanese Patent Application 2014-250687, and they will be summarized here only briefly, particularly in relation to aluminum and other metal donor films.

Laser 26 directs a laser beam 41 comprising a train of sub-nanosecond laser pulses, toward donor sheet 32. For example, in the embodiment illustrated in FIGS. 2A and 2B, laser 26 emitted pulses of duration 400 ps at a wavelength of 532 nm, with fluence in the range of 0.75 J/cm$^2$ at donor film 36. Donor films of thickness between 0.3 µm and 1.5 µm were irradiated in this configuration, at a distance D of at least 0.1 mm from acceptor substrate 22.

Figure 2B:
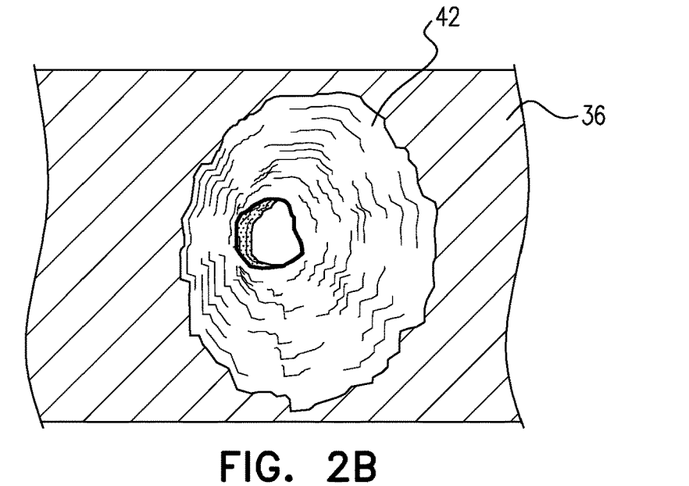
FIG. 2B is a schematic, pictorial view of a donor film following LIFT-driven ejection of a metal droplet in accordance with an embodiment of the present invention.

FIG. 2B is a schematic, pictorial view of donor film 36 following LIFT-driven ejection of droplet 44 in accordance with an embodiment of the present invention. The choice of laser pulse parameters described above gives rise to a "volcano" pattern 42 in the donor film. This "volcano-jetting" regime causes a single droplet 44 to be emitted with high directionality, typically within about 5 mrad of the normal to the film surface. The sizes of the droplets can be controlled by adjusting the energy, pulse duration, and focal spot size of laser beam 41 on donor film 36, as well as the thickness of the donor film. Depending on these parameter settings, the volume of droplets 44 can typically be adjusted within the range of 10 to 100 femtoliter, but the inventors have found that droplet volumes as small as 20 µm$^3$ can produce acceptable results.

An important consequence of the high directionality of drop ejection is that a relatively large gap D can be permitted between donor sheet 32 and acceptor substrate 22 without compromising the printing accuracy. Donor substrate 34 under these conditions can readily be positioned with film 36 at least 0.1 mm away from the acceptor substrate, and can typically be positioned at least 0.2 mm away from the acceptor substrate or even as far as 0.5 mm away while the pulses of the laser radiation impinge on the donor film.

LIFT-driven ejection of droplets takes place only when the laser fluence exceeds a given threshold, which depends on the donor film thickness, the laser pulse duration, and other factors. For short laser pulses (of duration 0.1-1 ns, as described above), single-droplet, "volcano-jetting" ejection will occur over a range of laser fluence values extending from the LIFT threshold up to an upper limit, which is typically about 50% greater than the threshold fluence. Above this upper fluence limit, each laser pulse will tend to induce ejection of many small droplets from the donor film, with nanoscale droplet dimensions.

Droplets 44 traverse the gap between donor film 36 and substrate 22, and then solidify rapidly as metal particles 46 on the surface of the substrate. The diameters of particles 46 depend on the sizes of droplets 44 that produced them, as well as on the size D of the gap traversed by the particles. Typically, in the volcano-jetting regime, particles 46 have diameters less than 5 µm, and the diameter can be reduced to less than 2 µm by appropriate setting of the LIFT parameters described above. Even over a large gap (>0.2 mm), the sub-nanosecond laser pulses enable stable formation and jetting of small single droplets, taking advantage of the naturally high surface tension of the molten metal.

As molten aluminum droplets 44 pass through the gap between donor and acceptor, the outer surface of the droplets oxidizes rapidly in ambient air or other oxygen-containing atmospheres. An aluminum oxide layer thus forms on the outer surfaces of particles 46. This oxide surface layer causes the resistivity of the particles to increase, relative to bulk aluminum, due to the insulating properties of the oxide. The resistivity increases markedly with the size D of the gap traversed by the droplets, since the size of the gap determines the length of time that the droplets spend in the air. Resistivity also increases with decreasing droplet size, due to the resulting increase of the ratio of the surface area of the corresponding particle 46 to its volume.

By appropriate choice of the irradiation parameters in system 20, however, low resistivity between the metal trace and substrate can consistently be achieved. These irradiation parameters include the energy and duration of the laser pulses, the gap between donor sheet 32 and acceptor substrate 22, and the thickness and composition of donor film 36. When these parameters are set to achieve a sufficient droplet volume (for example, at least 20 µm$^3$) and high droplet velocity (for example, at least 200 m/sec), the oxide layer that forms around droplets 46 is broken by the impact of droplets 44 on substrate 22, resulting in low resistivity. High droplet velocity enhances this effect, since the droplets spend a shorter time in the air, and the thickness of the oxide layer is accordingly reduced. Furthermore, larger droplets have a larger volume/surface ratio, and therefore have a smaller fraction of oxide to pure aluminum. (On breakdown the oxide particles mix with the bulk.) Additionally or alternatively, the space between donor sheet 32 and substrate 22 may be evacuated or flushed with an inert gas in order to avoid oxidation and thus reduce resistivity. Further alternatively, as noted earlier, droplet volume and/or velocity can be intentionally reduced in order to produce contacts with higher resistivity and/or diode-like properties.

Figure 3:
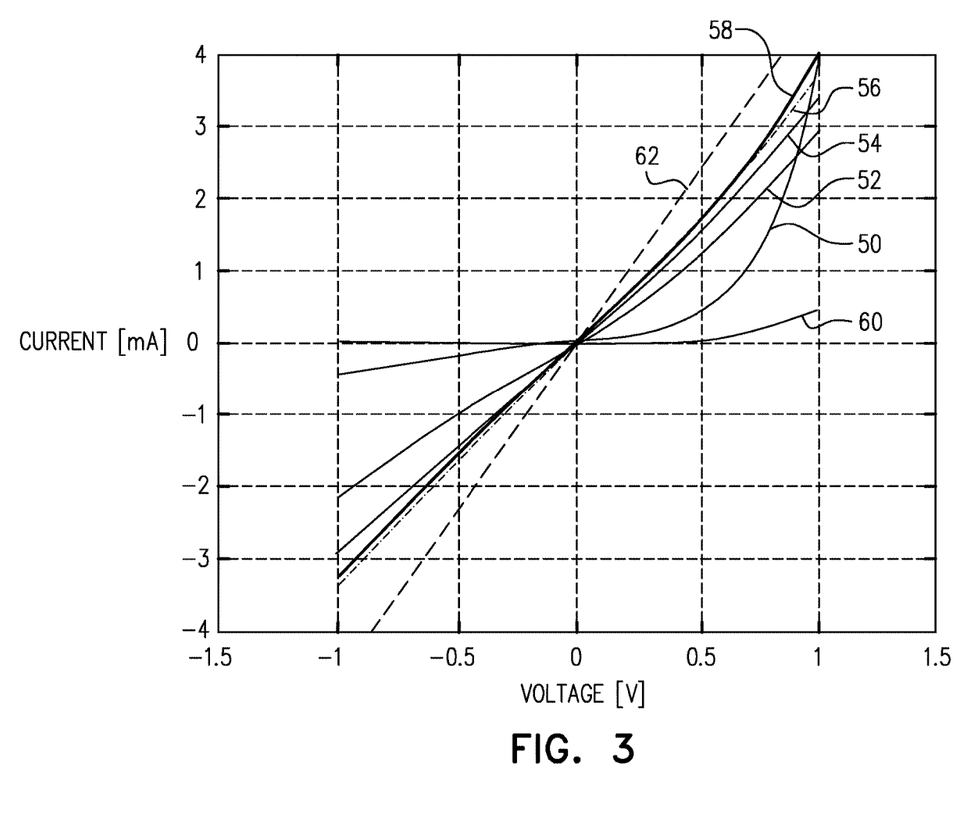
FIG. 3 is a plot of current against voltage measured through metal contacts printed on a silicon substrate under various deposition conditions, in accordance with an embodiment of the invention.

FIG. 3 is a plot of current against voltage measured through metal traces printed on a silicon substrate under different deposition conditions, in accordance with an embodiment of the invention. Curves 50-58 represent results obtained for printed pads using single-droplet volcano-jetting in system 20 at different laser pulse energies, specifically:

Curve 50—2.53 µJ/pulse.
Curve 52—2.81 µJ/pulse.
Curve 54—3.1 µJ/pulse.
Curve 56—3.38 µJ/pulse.
Curve 58—3.66 µJ/pulse.

The lowest pulse energy, in curve 50, was close to the lower threshold for jetting, whereas the highest pulse energy, in curve 58, was close to the spreading regime, in which multiple micro-droplets are simultaneously ejected. The pads were not annealed before measuring the characteristics shown in the figure.

Curves 60 and 62 show the contact characteristics for thermally-evaporated aluminum pads, before and after annealing, respectively. It can thus be seen that above about 3 µJ/pulse, single-droplet LIFT deposition, without subsequent annealing, achieves resistivity close to that of annealed aluminum. The contact resistance between the LIFT-deposited metal traces and the wafer was less than 0.2 mΩ·cm$^2$. Specifically, for traces on p-type silicon, the inventors measured contact resistivity of 0.15 mΩ·cm$^2$, while for p+ type silicon the measured resistivity was only 0.03 mΩ·cm$^2$.

At low pulse energy, as illustrated by curve 50, for example, the contact is of Schottky characteristic, whereas when the energy is increased the contact is ohmic. This feature could be applied in printed micro-electronic device applications, in order to tune contact characteristics from Schottky diode to ohmic.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for metallization, comprising:
providing a transparent donor substrate having deposited thereon a donor film comprising a metal with a thickness less than 2 µm;
positioning the donor substrate in proximity to an acceptor substrate comprising a semiconductor material with the donor film facing toward the acceptor substrate and with a gap of at least 0.1 mm between the donor film and the acceptor substrate; and
directing a train of laser pulses, having a pulse duration less than 2 ns, to impinge on the donor substrate so as to cause droplets of the metal to be ejected from the donor layer and land on the acceptor substrate, thereby forming a circuit trace in ohmic contact with the semiconductor material,
wherein directing the laser pulses comprises forming the circuit trace with a contact resistance, without annealing of the circuit trace, that is less than 0.2 mΩ·cm$^2$ between the metal and the semiconductor material.

2. The method according to claim 1, wherein the thickness of the donor film is between 0.3 µm and 1.5 µm.

3. The method according to claim 1, wherein the pulse duration is between 0.1 ns and 1 ns.

4. The method according to claim 3, wherein the pulse duration is less than 0.5 ns.

5. The method according to claim 1, wherein the laser pulses have an energy of at least 3 µJ per pulse, and wherein directing the train of pulses comprises focusing the laser pulses to impinge on the donor film with a spot size less than 35 µm.

6. The method according to claim 1, wherein directing the train of laser pulses comprises setting parameters of the laser radiation so that each pulse induces ejection of a single droplet of the metal from the donor film.

7. The method according to claim 6, wherein the single droplet ejected in response to each pulse has a volume of at least 20 µm$^3$ and is ejected from the donor film at a velocity of at least 200 m/sec.

8. The method according to claim 1, wherein positioning the donor substrate comprises placing the donor substrate so that the gap between the donor film and the acceptor substrate is at least 0.2 mm.

9. The method according to claim 1, wherein positioning the donor substrate comprises positioning the donor and acceptor substrates together in an atmosphere of ambient air, wherein the droplets of the metal pass through the ambient air between the donor and acceptor substrates.

10. The method according to claim 1, wherein the acceptor substrate comprises a silicon wafer.

11. The method according to claim 10, wherein the silicon wafer is configured as a photovoltaic cell.

12. The method according to claim 1, wherein the metal comprises aluminum.

13. Apparatus for material deposition, comprising:
a transparent donor substrate having deposited thereon a donor film comprising a metal with a thickness less than 2 µm;
a positioning assembly, which is configured to position the donor substrate in proximity to an acceptor substrate comprising a semiconductor material with the donor film facing toward the acceptor substrate and with a gap of at least 0.1 mm between the donor film and the acceptor substrate; and
an optical assembly, which is configured to direct pulses of laser radiation, having a pulse duration less than ns, to impinge on the donor substrate so as to cause droplets of the a metal to be ejected from the donor layer and land on the acceptor substrate, thereby forming a circuit trace in ohmic contact with the semiconductor material,
wherein the optical assembly is configured to generate the pulses of laser radiation so as to form the circuit trace with a contact resistance, without annealing of the circuit trace, that is less than 0.2 mΩ·cm$^2$ between the metal and the semiconductor material.

14. The apparatus according to claim 13, wherein the thickness of the donor film is between 0.3 µm and 1.5 µm.

15. The apparatus according to claim 13, wherein the pulse duration is between 0.1 ns and 1 ns.

16. The apparatus according to claim 15, wherein the pulse duration is less than 0.5 ns.

17. The apparatus according to claim 13, wherein the laser pulses have an energy of at least 3 µJ per pulse, and wherein the optical assembly is configured to focus the laser pulses to impinge on the donor film with a spot size less than 35 µm.

18. The apparatus according to claim 13, wherein the parameters of the laser radiation are set so that each pulse induces ejection of a single droplet of the metal from the donor film.

19. The apparatus according to claim 18, wherein the single droplet ejected in response to each pulse has a volume of at least 20 µm$^3$ and is ejected from the donor film at a velocity of at least 200 m/sec.

20. The apparatus according to claim 13, wherein the positioning assembly is configured to position the donor substrate so that the gap between the donor film and the acceptor substrate is at least 0.2 mm.

21. The apparatus according to claim 13, wherein the donor and acceptor substrates are positioned together in an atmosphere of ambient air, wherein the droplets of the metal pass through the ambient air between the donor and acceptor substrates.

22. The apparatus according to claim 13, wherein the acceptor substrate comprises a silicon wafer.

23. The apparatus according to claim 22, wherein the silicon wafer is configured as a photovoltaic cell.

24. The apparatus according to claim 13, wherein the metal comprises aluminum.

* * * * *